United States Patent
Tipple et al.

(10) Patent No.: US 10,094,873 B2
(45) Date of Patent: Oct. 9, 2018

(54) HIGH CAPACITY I/O (INPUT/OUTPUT) CELLS

(71) Applicant: FREESCALE SEMICONDUCTOR, INC., Austin, TX (US)

(72) Inventors: David R. Tipple, Leander, TX (US); Alistair J. Gorman, Broughty Ferry (GB); Anis M. Jarrar, Austin, TX (US)

(73) Assignee: NXP USA, Inc., Austin, TX (US)

( * ) Notice: Subject to any disclaimer, the term of this patent is extended or adjusted under 35 U.S.C. 154(b) by 274 days.

(21) Appl. No.: 14/839,333

(22) Filed: Aug. 28, 2015

(65) Prior Publication Data

US 2017/0059650 A1  Mar. 2, 2017

(51) Int. Cl.
*H01L 21/66* (2006.01)
*G01R 31/28* (2006.01)
*H01L 21/768* (2006.01)

(52) U.S. Cl.
CPC ..... *G01R 31/2896* (2013.01); *G01R 31/2884* (2013.01); *G01R 31/2886* (2013.01); *H01L 21/76877* (2013.01); *H01L 21/76895* (2013.01)

(58) Field of Classification Search
CPC ............ G01R 31/2896; G01R 31/2884; G01R 31/2886; H01L 21/76877; H01L 21/76895
USPC .......................................................... 438/18
See application file for complete search history.

(56) References Cited

U.S. PATENT DOCUMENTS

| | | | |
|---|---|---|---|
| 5,568,054 A | 10/1996 | Iino et al. | |
| 6,570,796 B2 | 5/2003 | Sung | |
| 7,119,568 B2 | 10/2006 | Marr | |
| 7,282,945 B1 | 10/2007 | Beaman et al. | |
| 7,400,028 B2 * | 7/2008 | Tomita | H01L 23/522 257/620 |
| 7,629,689 B2 | 12/2009 | Maeda | |
| 7,723,998 B2 * | 5/2010 | Doi | G06F 21/75 324/555 |
| 9,059,052 B2 * | 6/2015 | Chen | H01L 22/14 |
| 2003/0016036 A1 | 1/2003 | Ahn et al. | |
| 2009/0206856 A1 | 8/2009 | Nam et al. | |
| 2014/0234757 A1 * | 8/2014 | Matusiewicz | G03F 1/14 430/5 |

(Continued)

FOREIGN PATENT DOCUMENTS

EP    1218765 B1    1/2006

OTHER PUBLICATIONS

Goldstein, "Probe Cards Enable Wafer-level Test", Solid State Technology, 2005, pp. 1-7.

(Continued)

*Primary Examiner* — Vu A Vu

(57) ABSTRACT

A wafer structure has a plurality of semiconductor die. Each semiconductor die includes circuitry, a test pad for use in testing the circuitry, and a plurality of external pins. The test pad includes first, second, third, and fourth metal lines, a via, and a metal cover that receives a probe. The first and second metal lines are in a first metal layer and run in parallel, are insulated from each other, and are adjacent. The third and fourth metal lines are in a second metal layer run in parallel, are insulated from each other, and run orthogonal to the first and second metal lines. The first via is coupled to the first metal line and the third metal line. One or more external pins are connected to the metal cover.

20 Claims, 8 Drawing Sheets

(56) References Cited

U.S. PATENT DOCUMENTS

2014/0292364 A1* 10/2014 Chang ................ G01R 1/06761
324/755.01
2015/0279780 A1* 10/2015 Zhang ................ H01L 21/7681
257/774

OTHER PUBLICATIONS

Ganesan et al, "Wafer-level burn-in with test", Solid State Technology, 2002, pp. 1-7.
Pitts, "KGD Through Full Wafer Burn-In", OnBoard Technology, Apr. 2005, pp. 52-54.
Zakaria et al, "Reducing burn-in time through high-voltage stress test and Weibull statistical analysis", IEEE Design & Test of Computers, Mar.-Apr. 2006, pp. 88-98, vol. 23, issue 2.
Huebner, "A Hot Topic: Current Carrying Capacity, Tip Melting and Arcing", IEEE SW Test Workshop, Jun. 12-15, 2011, pp. 1-20.
Kister, " Key Design Parameters to Maximize Probe Current Carrying Capability", IEEE SW Test Workshop, Jun. 12-15, 2011, pp. 1-14.
Kaczinsky et al, "Aspects of High Power Probing", IEEE SW Test Workshop, Jun. 12-15, 2011, pp. 1-24.
Hohenwarter, "Power Delivery Network Analysis—a case for true 3D simulations", IEEE SW Test Workshop, Jun. 12-15, 2011, pp. 1-27.

\* cited by examiner

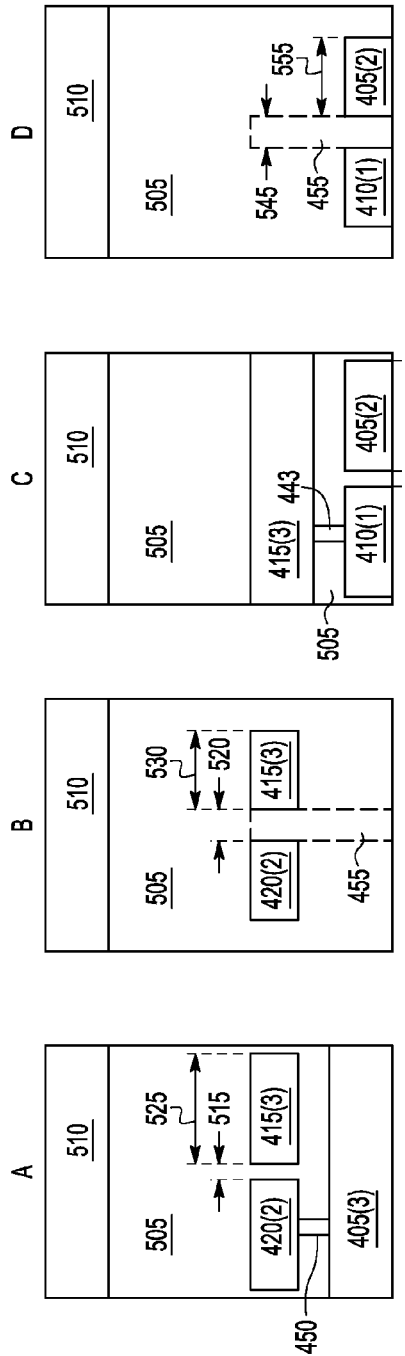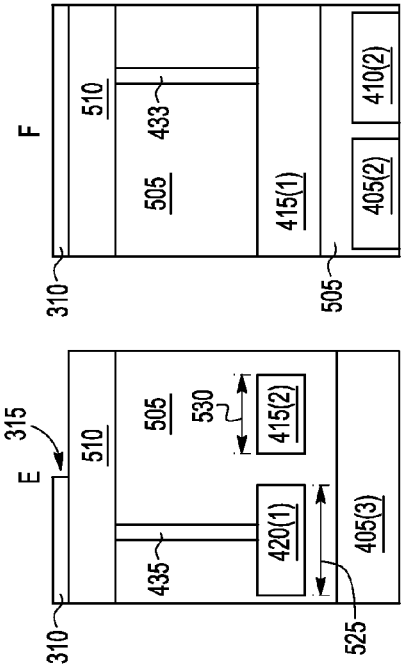

HIGH CAPACITY I/O (INPUT/OUTPUT) CELLS

BACKGROUND

Field

This disclosure relates generally to testing integrated circuits, and more specifically, to utilizing high capacity I/O (input/output) cells for testing integrated circuits.

Related Art

Integrated circuits, such as a die, are often tested for failures after being incorporated into a packaged semiconductor device, which may be referred to as "package-level" testing. However, package-level testing may be quite expensive due to lost fabrication costs that occur when a defective package is discarded.

BRIEF DESCRIPTION OF THE DRAWINGS

The present invention may be better understood, and its numerous objects, features, and advantages made apparent to those skilled in the art by referencing the accompanying drawings.

FIG. 5-10 illustrate partial cross-sectional side views depicting the example high capacity I/O cell structure of FIG. 4, according to some embodiments.

The present invention is illustrated by way of example and is not limited by the accompanying figures, in which like references indicate similar elements, unless otherwise noted. Elements in the figures are illustrated for simplicity and clarity and have not necessarily been drawn to scale.

DETAILED DESCRIPTION

Figure 1:
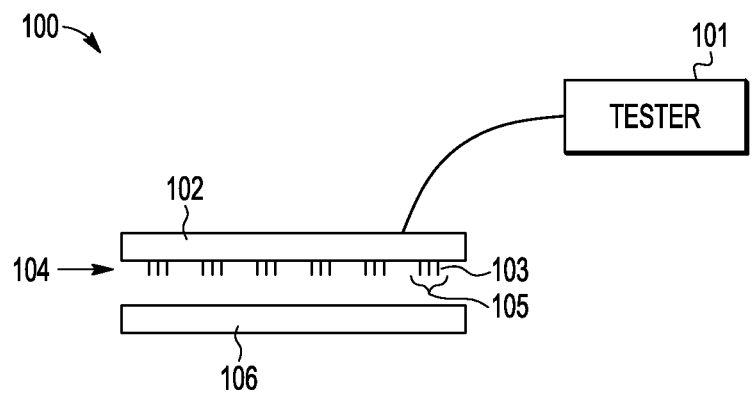
FIG. 1 illustrates a block diagram depicting an example testing environment in which the disclosure is implemented, according to some embodiments.

The following sets forth a detailed description of various embodiments intended to be illustrative of the invention and should not be taken to be limiting.

Overview

Conventionally, design flow of packaged semiconductor devices includes wafer fabrication, probe test of the wafer, singulation of the wafer into multiple die, and packaging each die into an individual packaged semiconductor device (also referred to as a package). Traditional burn-in testing is then performed on an individual package basis, which includes placing the package in an oven at an elevated temperature and electrical signals are applied to exercise or test the package. The package is removed from the oven and may again be tested for failures. If any defective part is found in a package, the entire package is discarded. Burn-in testing also requires that the package be placed in the oven for a large amount of time (e.g., 15 to 20 minutes). While a number of packages may be tested in parallel, it is generally prohibitively expensive for a testing facility to perform massively parallel burn-in testing, since the equipment needed for such testing scales up as the number of packages being tested scales up.

It is desirable to reduce fabrication costs by eliminating defective parts much earlier in the design flow, without needing to discard the entire package. An alternative approach to traditional burn-in testing is wafer-level stress testing performed after wafer fabrication (e.g., at probe test). Wafer-level stress testing applies electrical signals to die of a wafer under test for a period of time, which may introduce some self-heating of the die under test. Other electrical signals can also be applied to exercise or test the die during that period of time. An elevated temperature may also be applied to the die under test, which is provided by a heated and controlled probe chuck. The die may be tested again for failures after that period of time. Any defective die are discarded before packaging, which avoids the fabrication cost of packaging failed die into packages.

Wafer-level stress testing uses a probe card to apply the electrical signals to a die under test. Since stress testing involves long stress times per die under test, it is beneficial to perform massively parallel wafer-level stress testing of multiple die in order to offset such stress times (e.g., concurrently testing a third of the die on a wafer, where 3000 to 4000 die are included on a single 12 inch wafer). However, massive parallel wafer-level stress testing quickly becomes cost prohibitive for high power die under test. For example, a standard probe test setup cannot be used for performing wafer-level stress testing on high power die, due in part to the standard probe test setup failing to meet the large power requirements for performing massively parallel stress testing of multiple die under test concurrently for long stress times, where each die under test includes a large number of conventional probe pads. Additional probe pins may also be required to introduce the electrical signals required for wafer stressing at high temperatures and to observe high current consumption in the die under test, in addition to the probe pins needed to perform wafer testing.

The die must also include additional probe pads corresponding to the additional probe pins. Conventional layout design of a die restricts placing probe pads over active circuitry in a core area of the die, such as over the power distribution grid of a die, because the forces involved in touching the probe pin to the probe pad will likely destroy or short any metal layers underlying the probe pad, especially as the size of the probe pad increases. Such restrictions greatly limit the available areas on a die in which an additional probe pads can be added, especially as the size of the probe pads increases to handle corresponding larger probe pins. Further, since such probe pads are conventionally only used during testing, the probe pads otherwise occupy a large area that cannot be used during operation of the die (e.g., during run-time after being packaged into a packaged semiconductor device).

The present disclosure provides a scalable approach for wafer-level stress testing by implementing high capacity I/O (Input/Output) cells that are integrated into the power distribution grid of each die of a wafer, which increases the available area in which high capacity I/O cells can be placed on the die, including within a core area of the die and within a peripheral area of the die. A high capacity I/O cell has a structure that includes a contact pad placed over metal lines of the power distribution grid. The structure of the high capacity I/O cell also includes oxide pillars formed between the metal lines of the grid that underlie the contact pad to reinforce the physical rigidity of the high capacity I/O cell and avoid damaging any underlying metal lines during probing. The structure of the high capacity I/O cell also includes a connection, such as a via, between the contact pad and a power line, a ground line, or a signal line that underlies the contact pad.

The high capacity I/O cell is configured to withstand high voltage and high current electrical signals used during wafer-level stress testing, which reduces the number of probe pins needed to make contact with the die to power the die, which in turn reduces the cost of the probe card. The contact pad of the high capacity I/O cell is also larger than a standard probe pad (e.g., four times larger) and is configured to accommodate the larger probe pins that may be required to handle higher voltage or higher current electrical signals used during wafer-level stress testing. This provides an additional benefit of increasing the longevity of older probe technology that uses larger probe pins. Additionally, the high capacity I/O cells can be re-used as power pads, ground pads, or signal pads during run-time operation of the die, and may utilize the same electrostatic discharge (ESD) and pad electronics as standard signal pads.

EXAMPLE EMBODIMENTS

FIG. 1 illustrates a block diagram depicting an example testing environment 100 in which the disclosure is implemented, according to some embodiments. It is noted that the figures discussed herein are simplified for ease of illustration and explanation, and are not necessarily to scale. Testing environment 100 includes a tester 101, or equipment that is configured to perform testing operations on a wafer 106, including wafer-level stress testing, also referred to as a wafer-level burn-in test. Wafer 106 is a semiconductor wafer that includes a plurality of semiconductor die. Tester 101 is connected to a probe card 102 that includes a plurality of probe pins 104. The plurality of probe pins 104 are arranged into a number of pin groups 105 that each correspond to a respective die of wafer 106. Each probe pin 103 of a pin group 105 is aligned with a probe pad on the respective die.

Tester 101 is configured to perform testing operations simultaneously on a set of die of wafer 106 to achieve massive parallel testing, stressing, or both testing and stressing of the die. The set of die includes a number of die up to and including the entire plurality of die. In some embodiments, the plurality of die are logically divided into two or more sets of die, each set of die being located within a respective area of the wafer 106. In some embodiments, each set of die includes at least 100 die. Tester 101 is configured to align probe card 102 over each respective area on the wafer 106 (and to align each pin group 105 of the probe card 102 with a respective die within the respective area) and to simultaneously test the die located within the respective area. In some embodiments, tester 101 performs wafer-level burn-in testing by controlling probe pins to apply high voltage electrical signals to each die within the respective area on wafer 106 at elevated temperatures and to provide power to the die. Tester 101 also controls probe pins to exercise nodes within each die using input test signals, as well as to receive output test signals that may indicate failures.

Figure 2:
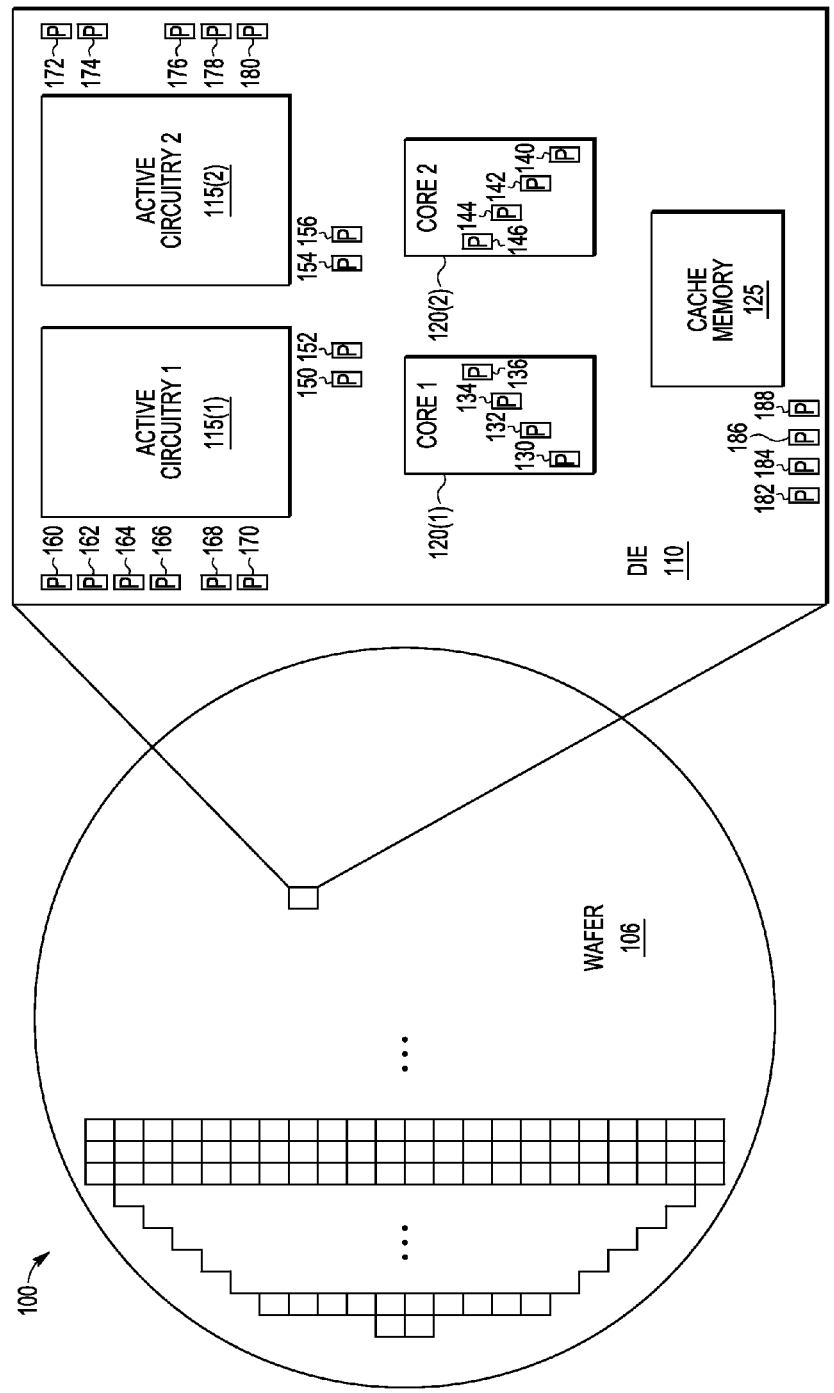
FIG. 2 illustrates a block diagram depicting an example wafer tested in the testing environment of FIG. 1, according to some embodiments.

FIG. 2 illustrates a block diagram depicting an example wafer 106 tested in the testing environment of FIG. 1. Wafer 106 includes a plurality of die, where each die 110 of wafer 106 includes a number of components that are arranged on the die in a same component layout. A simplified component layout of die 110 is shown in magnification to the right in FIG. 2. For ease of illustration, it is noted that not all components of die 110 are illustrated, such as standard signal pads, a power distribution grid, and interconnects that communicatively couple the illustrated components. The illustrated components of die 110 are described below.

Die 110 includes active circuitry 115, which includes integrated circuit components that are active when die 110 is powered. In the embodiment illustrated, die 110 includes two areas of active circuitry 115(1) and 115(2). The integrated circuit components of active circuitry 115(1) and 115(2) include semiconductor devices and interconnects that may form voltage or power supply regulators, power management circuitry, clock sources, a system controller, interface circuitry, testing circuitry, and the like for operating die 110.

Die 110 also includes one or more processing units or cores 120, which cooperate to form a computing component that reads and executes program instructions. In the embodiment shown, die 110 includes two cores 120(1) and 120(2). Core 120(1) and core 120(2) also include integrated circuit components, such as semiconductor devices and interconnects, that are active when die 110 is powered.

Die 110 also includes cache memory 125, which is volatile memory that is quickly accessible by each core 120(1) and 120(2) when executing program instructions, such as high-speed random-access memory (RAM). Die 110 may also include forms of non-volatile memory, such as read-only memory (ROM), electrically erasable programmable read-only memory (EEPROM), flash memory, and the like.

Die 110 also includes a number of high capacity I/O cells (also referred to as I/O cells, I/O pads, or test pads), which are illustrated as boxes 130-188 including the letter P. I/O pads are larger than standard signal pads (e.g., four times larger) and are configured to withstand the high voltage and high current electrical signals used during wafer-level testing. For example, in one embodiment, an I/O pad can handle current on the order of half an Amp, or 500 mA. I/O pads are also configured to withstand the wattage needed to provide power to cores 120(1) and 120(2) and active circuitry 115(1) and 115(2) during wafer-level testing. For example, in one embodiment, multiple I/O pads can be used to handle 2 Amps, which is the power consumed by the cores 120(1) and 120(2) operating at 1 GHz. I/O pads are incorporated into the power distribution grid, as further discussed below in connection with FIGS. 3 and 4.

I/O pads serve as probe pads during wafer-level testing of die 110, where each I/O pad on die 110 is aligned with a probe pin 103 of a respective pin group 105. I/O pads may be located near components of die 110 in order to provide power to the components during wafer-level testing, or to communicate input or output test signals between tester 101 and the components of die 110. I/O pads may also be located within a core or interior area of die 110 (like I/O pads 150-156 near active circuitry 115 and cores 120) or around the periphery or edges of die 110 (like I/O pads 182-188 near cache memory). I/O pads (like I/O pads 130-146) may also be located over cores 120(1) and 120(2) in order to provide dedicated power to cores 120(1) and 120(2) during wafer-level testing. I/O pads located around the periphery of die 110 (such as I/O pads 160-188) may also be used as signal pads of die 110 after wafer-level testing, such as when die 110 is incorporated into a packaged semiconductor device and the signal pads are coupled to external signal and power connections (e.g., external input/output pins of the packaged semiconductor device.

Figure 3:
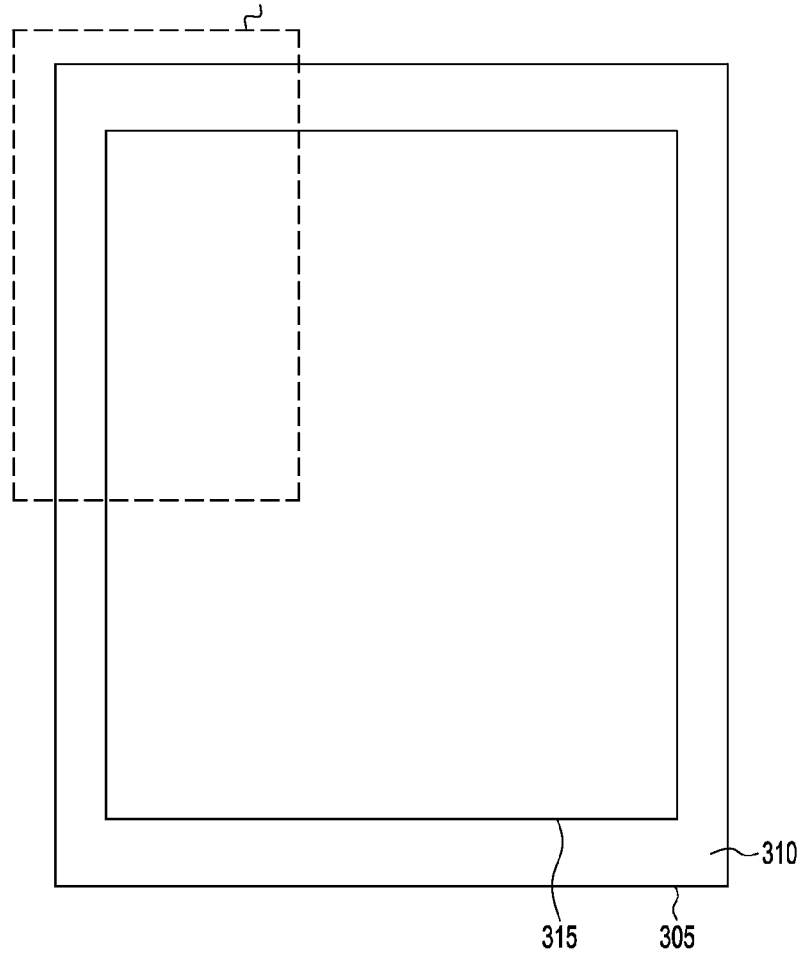
FIG. 3 illustrates a top-down view depicting an example high capacity I/O cell structure in which the disclosure is implemented, according to some embodiments.

FIG. 3 illustrates a top-down view depicting an example high capacity I/O cell structure (also referred to as I/O pad structure or test pad structure) 300 in which the disclosure is implemented. I/O pad structure 300 includes a contact pad 305 formed from a suitable metal, such as aluminum. The surface of contact pad 305 is bondable (e.g., is suitable for forming wire-bonds, copper pillars, solder bumps, or other connection on contact pad 305). Passivation layer 310 overlies contact pad 305, where contact pad 305 is exposed within an opening 315 of passivation layer 310. One or more probe pins of the probe card make contact with I/O pad structure 300 within opening 315. In some embodiments, the I/O pad structure also has a deposited metal structure (such as solder bumps or similar structure) formed directly on the metal of contact pad 305, where the deposited metal structure is contacted by a probe interface or probe pins. In some embodiments, the I/O pad structure can be an input pin, an output pin, a control signal pin, or a high voltage pin. A schematic plan view of a portion of the I/O pad structure 300 (where the portion is outlined by a broken line) is shown in magnification in FIG. 4.

Figure 4:
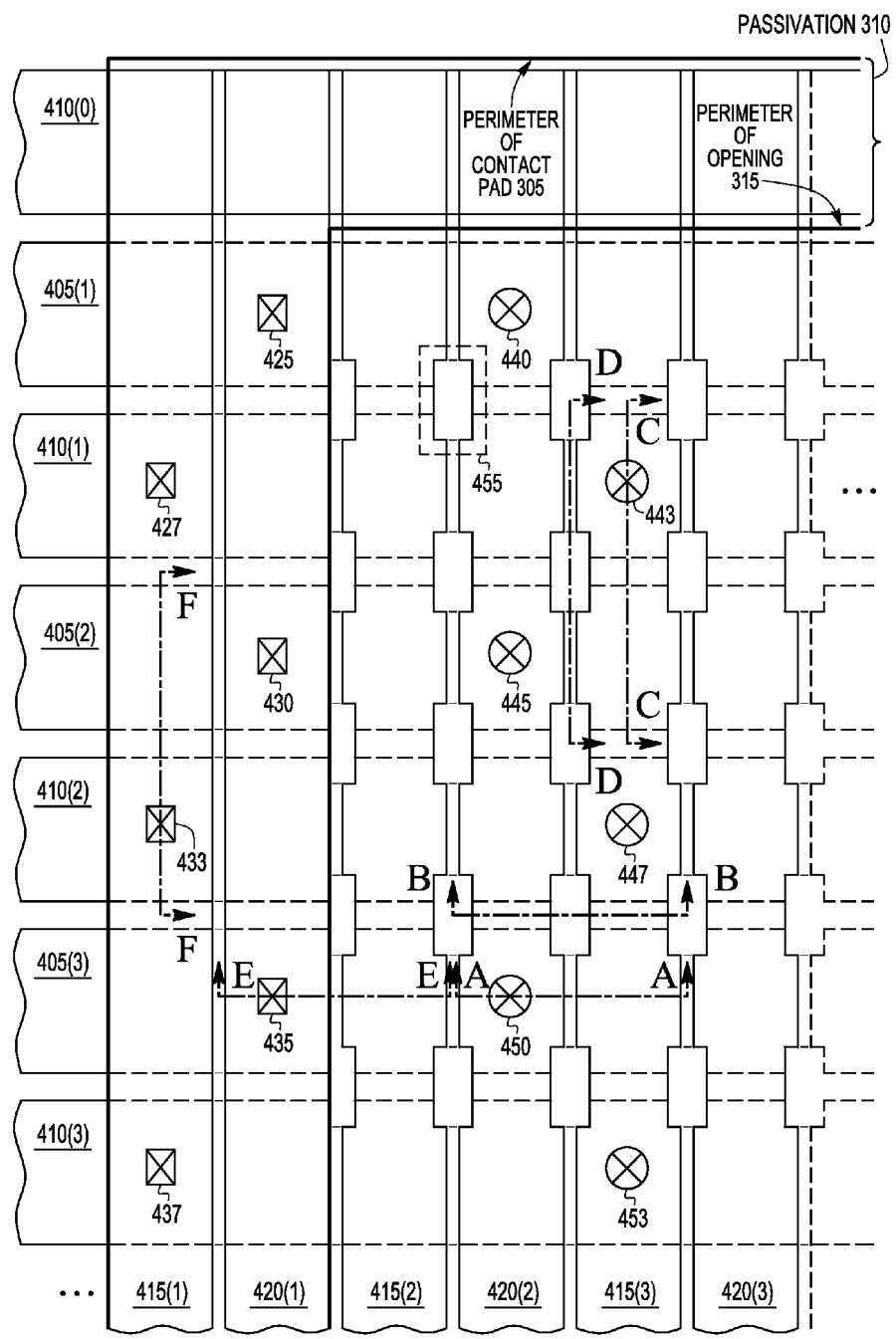
FIG. 4 illustrates a schematic plan view depicting the example high capacity I/O cell structure of FIG. 3, according to some embodiments.

FIG. 4 illustrates a schematic plan view depicting a portion of the example high capacity I/O cell structure 300 of FIG. 3. Cross-sectional side views of the example high capacity I/O cell structure 300 are shown in FIG. 5-10. Contact pad 305 overlies a plurality of power supply lines of the power distribution grid of die 110, which are shown in the schematic plan view of FIG. 4. For orientation's sake, an outer perimeter of contact pad 305 and a perimeter of the opening 315 in passivation layer are illustrated by thick lines, which are formed above the power supply lines shown in FIG. 4. In the embodiment shown in FIG. 4, power supply lines are formed in the top two metal layers of the die (e.g., copper metal layers), where the power supply lines formed in one metal layer are orthogonal to the power and ground lines formed in the other metal layer (e.g., are perpendicular to one another as viewed from above, as shown in the schematic plan view of FIG. 4). Power supply lines include power lines (e.g., carrying VDD or similar voltage) and ground lines (e.g., carrying 0V or ground), which are alternated in each layer. Power supply lines are formed from a suitable metal, such as copper. Power supply lines are insulated from one another with a suitable insulating material, such as one or more oxide layers around the metal layers (e.g., between, above, and under the metal layers) or one or more Inter-Layer Dielectric (ILD) layers.

As shown in FIG. 4, a number of power supply lines 415(1)-(N) and 420(1)-(N) are formed in a top metal layer of die 110. In some embodiments, lines 415 are part of a positive power supply voltage rail and carry a positive power supply voltage, such as VDD, while lines 420 are part of a negative power supply voltage rail and carry a negative power supply voltage, such as ground. A number of power supply lines 405(1)-(N) and 410(0)-(N) are formed in a metal layer underlying the top metal layer of die 110. Lines 405 are part of the negative power supply voltage rail and carry the negative power supply voltage (ground), while lines 410 are part of the positive power supply voltage rail and carry the positive power supply voltage (VDD). Lines 415 and 420 are orthogonal to lines 405 and 410. In the embodiments discussed herein, lines 405 and 420 are referred to as ground lines and lines 410 and 415 are referred to as power lines.

The power lines of the two metal layers are connected by a number of vies, or metal connections. The vias may be formed from the same metal used to form the power supply lines, such as copper. Each via is formed between a power line in the top metal layer and an orthogonal power line in the underlying metal layer within an area where the power lines overlap. Similarly, the ground lines of the two metal layers are connected by a number of vias formed between a ground line in the top metal layer and an orthogonal ground line in the underlying metal layer within an area where the ground lines overlap. Vias formed between power supply lines are referred to as line-to-line vias (or copper-to-copper vias), which are illustrated as a circle with an X. For example, ground line 420(2) is connected to ground line 405(1) at line-to-line via 440, with ground line 405(2) at via 445, and with ground line 405(3) at line-to-line via 450. Similarly, power line 415(3) is connected to power line 410(1) at line-to-line via 443, with power line 410(2) at line-to-line via 447, and with power line 410(3) at line-to-line via 453. It is noted that only a representative set of line-to-line vias are shown in FIG. 4, where the power distribution grid implements a much greater number of line-to-line vias.

The contact pad 305 is placed over a portion of the power supply lines, wherever such power supply lines are formed on die 110 (e.g., the high capacity I/O cell is not limited to periphery of the die). In order to protect the underlying portion of power supply lines from damaging contact forces that may be involved during testing, each segment of power supply lines that underlie contact pad 305 within the perimeter of opening 315 (where probe pin contact will be made) are notched in a repeating pattern. The notches of each power supply line in one metal layer coincide with the notches of the alternating power supply lines in the other metal layer, which form rows of voids or hollows between the power supply lines. An oxide pillar 455 is formed in each hollow. Each oxide pillar 455 extends through both metal layers that contain the power supply lines (e.g., the top two metal layers of the die). Oxide pillars 455 are rigid in comparison to the surrounding power supply lines and minimize damaging contact forces experienced by the power supply lines during testing. It is noted that the power supply lines that do not fall within the perimeter of opening 315 (e.g., the power supply lines under the contact pad 305, but outside of opening 315) are not notched. An example pattern for notching the power supply lines is further discussed below in connection with FIG. 11-13.

In some embodiments, contact pad 305 is configured as a power grid pad that is connected either to power supply lines of the positive power supply voltage rail (e.g., power lines) or to power supply lines of the negative power supply voltage rail (e.g., ground lines). Vias are formed between one or more power supply lines of the respective rail and contact pad 305 within an area where contact pad 305 overlaps the one or more power supply lines. However, to avoid any damage to the vias between the power supply lines and contact pad 305 during testing, the vias are excluded from being formed with the perimeter of opening 315 and instead are formed outside of the perimeter of opening 315. In other words, the vias are formed within an area bounded by the perimeter of contact pad 305 and the perimeter of opening 315 under the passivation 310 of contact pad 305 (also referred to as a passivation area). Vias formed between a metal line (such as a power line or a ground line) and the contact pad 305 are referred to as line-to-pad (or copper-to-aluminum vias), which are illustrated in FIG. 4 as a box with an X. For example, in one embodiment, contact pad 305 is configured as a power grid pad that is connected to ground line 420(1) at line-to-pad vias 425, 430, and 435. During testing, the power grid pad serves as a ground supply terminal for the die. In another embodiment, contact pad 305 is a power grid pad that is connected to power line 415(1) at line-to-pad vias 427, 433, and 437. During testing, the power grid pad serves as a power supply terminal for the die. Although only one ground line and one power line is shown within the passivation area, more than one ground line and more than one power line may be included within the passivation area.

In other embodiments, contact pad 30 is configured as a signal pad that is connected to a signal line, where connections are formed between the contact pad and a metal layer below the two metal layers in which the positive and negative power supply voltage rails are formed (e.g., below the top two metal layers of the die). In such an embodiment, one or more of the power supply lines are absent (e.g., removed during the design phase of the die) under the contact pad within the passivation area in order to provide access to another underlying metal layer. One or more line-to-pad vias are formed within the passivation area to connect the contact pad with the underlying metal layer. For example, in such an embodiment, a segment of lines 415(1) and 420(1) may be absent under the passivation area of contact pad 305 and one or more vias may be placed under the passivation area to connect the contact pad to an underlying metal layer. Placement and configuration of a contact pad during the design phase is further discussed below in connection with FIG. 11-13.

Various partial cross-sectional side views depicting the example high capacity I/O cell structure of FIG. 4 are illustrated in FIG. 5-10. The cross-sectional side views show a top portion of the die that includes the top two metal layers that contain the power supply lines of FIG. 4, as well as the contact pad placed above the power supply lines. Although particular power supply lines are referenced in FIG. 5-10, the particular power supply lines are representative of the power supply lines underlying the contact pad of the high capacity I/O cell structure.

FIG. 5 illustrates a cross-sectional side view at broken line A that is parallel with line 405(3), cuts across orthogonal lines 420(2) and 415(3), and intersects line-to-line via 450. A metal layer 510 of contact pad 305 is shown at a top surface of the die 110. Lines 420(2) and 415(3) are formed in a top metal layer of die 110 (also referred to as an upper metal layer), and line 405(3) is formed in a next-to-top metal layer of die 110 (also referred to as a lower metal layer). Dielectric material 505 surrounds the power supply lines, including lines 420(2), 415(3), and 405(3). In the upper metal layer, lines 420(2) and 415(3) are separated by a distance 515, which is the minimum distance that separates alternating lines 420 and 415 in the upper metal layer. Both lines 420(2) and 415(3) have a width 525, which is the maximum width of alternating lines 420 and 415 in the upper metal layer. Line-to-line via 450 is formed between line 405(3) and line 420(2) where the lines overlap.

FIG. 6 illustrates a cross-sectional side view at broken line B that is parallel with broken line A and lies within the dielectric material that separates lines 405(3) and 410(2), intersecting an oxide pillar 455. In the upper metal layer, lines 420(2) and 415(3) are notched, which removes an edge portion of lines 420(2) and 415(3) and increases the distance separating lines 420(2) and 415(3) to a notched distance 520, which is the maximum distance that separates alternating lines 420 and 415 under the contact pad. In the embodiment shown, notched distance 520 is twice as wide as distance 515, although notched distance 520 may be larger or smaller in other embodiments. The notching also reduces the width 525 of the lines 420(2) and 415(3) to a notched width 530, which is the minimum width of alternating lines 420 and 415 under the contact pad. Line 405(3) and line 410(2) in the lower metal layer are also separated by a notched distance 545, as further discussed below in connection with FIG. 8. Oxide pillar 455 is formed within the space created by notched distances 520 and 545, extending through both the upper and lower metal layers between the power supply lines. Oxide pillar 455 is outlined in FIG. 6 by a broken line.

FIG. 7 illustrates a cross-sectional side view at broken line C that is parallel with line 415(3) and orthogonal to broken line A, cuts across orthogonal lines 410(1) and 405(2), and intersects line-to-line via 443. In the lower metal layer, lines 410(1) and 405(2) are separated by distance 540, which is the minimum distance that separates alternating lines 410 and 405 in the lower metal layer. Both lines 410(1) and 405(2) have a width 550, which is the maximum width of alternating lines 410 and 405 in the lower metal layer. Width 550 is not necessarily equal to width 525. Line-to-line via 443 is formed between line 410(1) and line 415(3) where the lines overlap.

FIG. 8 illustrates a cross-sectional side view at broken line D that is parallel with broken line C and lies within the dielectric material that separates lines 420(2) and 415(3), intersecting an oxide pillar 455. In the lower metal layer, lines 410(1) and 405(2) are notched, which removes an edge portion of lines 410(1) and 405(2) and increases the distance separating lines 410(1) and 405(2) to a notched distance 545, which is the maximum distance that separates alternating lines 410 and 405 under the contact pad. In the embodiment shown, notched distance 545 is twice as wide as distance 540, although notched distance 540 may be larger or smaller in other embodiments. Notched distance 545 is not necessarily equal to notched distance 520. The notching also reduces the width 550 of the lines 410(1) and 405(2) to a notched width 555, which is the minimum width of alternating lines 410 and 405 under the contact pad. As noted above, an oxide pillar 455 is formed within the space created by notched distances 520 and 545, extending through both the upper and lower metal layers between the power supply lines. Oxide pillar 455 is outlined in FIG. 8 by a broken line.

FIG. 9 illustrates one embodiment of a high capacity I/O cell that is configured as a power grid pad (e.g., connected to ground lines). FIG. 9 illustrates a cross-sectional side view at broken line E that is parallel with broken line A and with line 405(3), cuts across orthogonal lines 420(1) and 415(2), and intersects line-to-pad via 435. Passivation layer 310 is shown over a portion of the top surface of metal layer 510 of contact pad 305. In the upper metal layer, line 415(2) falls within the perimeter of opening 315 and is notched, having a notched width 530. Line 420(1) falls outside of the perimeter of opening 315 (as shown by being under the passivation layer 310) and is not notched, having a width 525. In the lower metal layer, line 405(3) has the width 550 under the passivation layer 310. The segment of line 405(3) that falls within the perimeter of opening 315 is repeatedly notched in a pattern, where the notches of line 405(3) coincide with the notches of alternating lines 415 and 420 within the perimeter of opening 315, as shown above in connection with FIG. 5-8. Line-to-pad via 435 is formed between line 420(1) and metal layer 510 under the passivation layer 310 (also referred to as being within the passivation area).

FIG. 10 illustrates another embodiment of a high capacity I/O cell that is configured as a power grid pad (e.g., connected to power lines). FIG. 10 illustrates a cross-sectional side view at broken line F that is parallel with line 415(1) and orthogonal to broken line A, cuts across orthogonal lines 405(2) and 410(2), and intersects line-to-pad via 433. Passivation layer 310 is shown over the top surface of metal layer 510 of contact pad 305. In the upper metal layer, line 415(1) falls outside of the perimeter of opening 315 (and is under the passivation layer 310) and is not notched, having uniform width 525. In the lower metal layer, lines 405(2) and 410(2) also fall outside of the perimeter of opening 315 (and are under the passivation layer 310) and are not notched, both having uniform width 550. Line-to-pad via 433 is formed between line 415(1) and metal layer 510 under the passivation layer 310.

In another embodiment of a high capacity I/O cell that is configured as a signal pad (e.g., connected to a signal line), one or more power supply lines are removed during placement and configuration during the design phase of the die layout, as further discussed below. For example, the configuration of a power grid pad illustrated in FIG. 9 can be altered into a configuration of a signal pad by removing segments of lines 420(1) and 405(3) that lie under passivation layer 310 and extending line-to-pad via 435 to another metal layer underlying the top two metal layers. Similarly, the configuration of a power grid pad illustrated in FIG. 10 can be altered into a configuration of a signal pad by removing segments of lines 415(1) and 410(2) that line under passivation layer 310 and extending line-to-pad via 433 to another metal layer underlying the top two metal layers.

Figure 11:
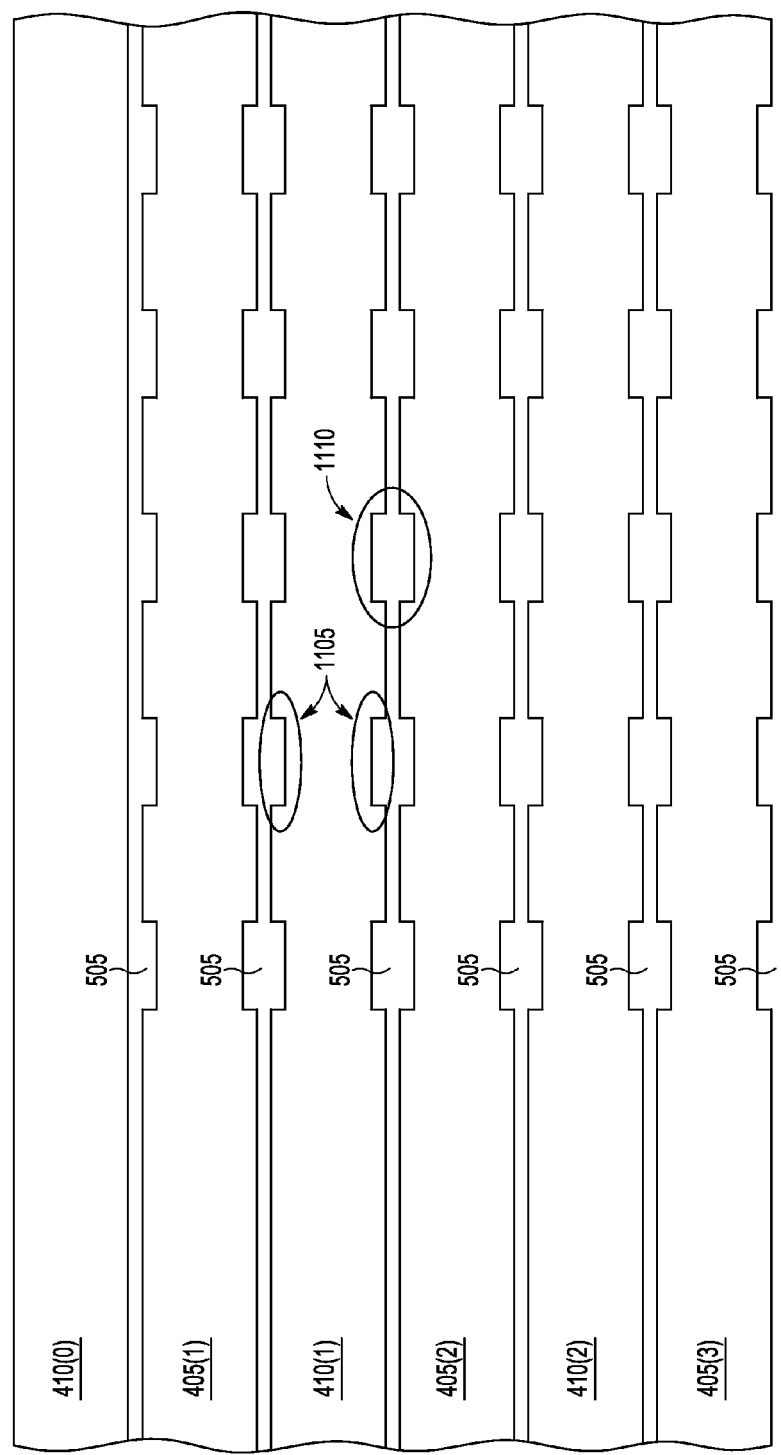
FIG. 11-13 illustrate partial schematic plan views depicting the example high capacity I/O cell structure of FIG. 4, according to some embodiments.
Figure 12:
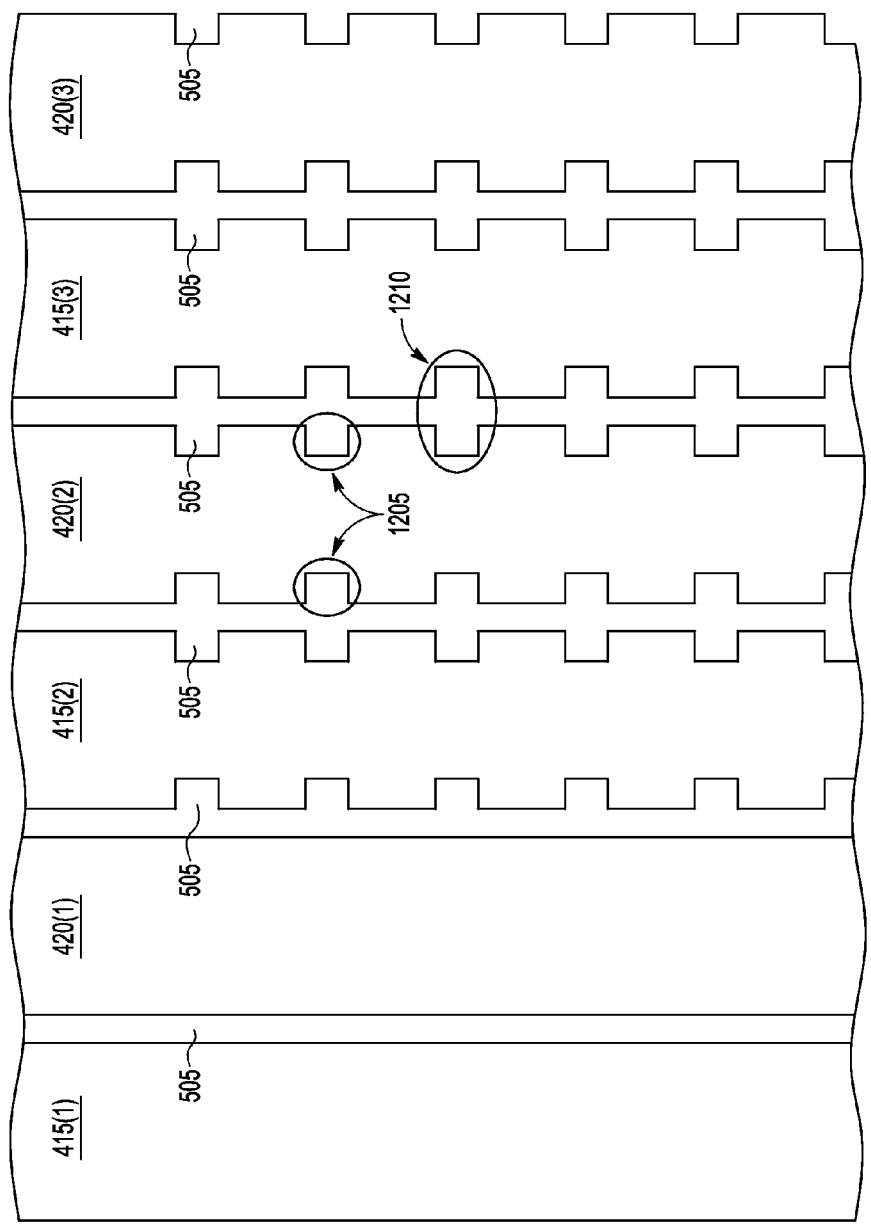
Figure 13:
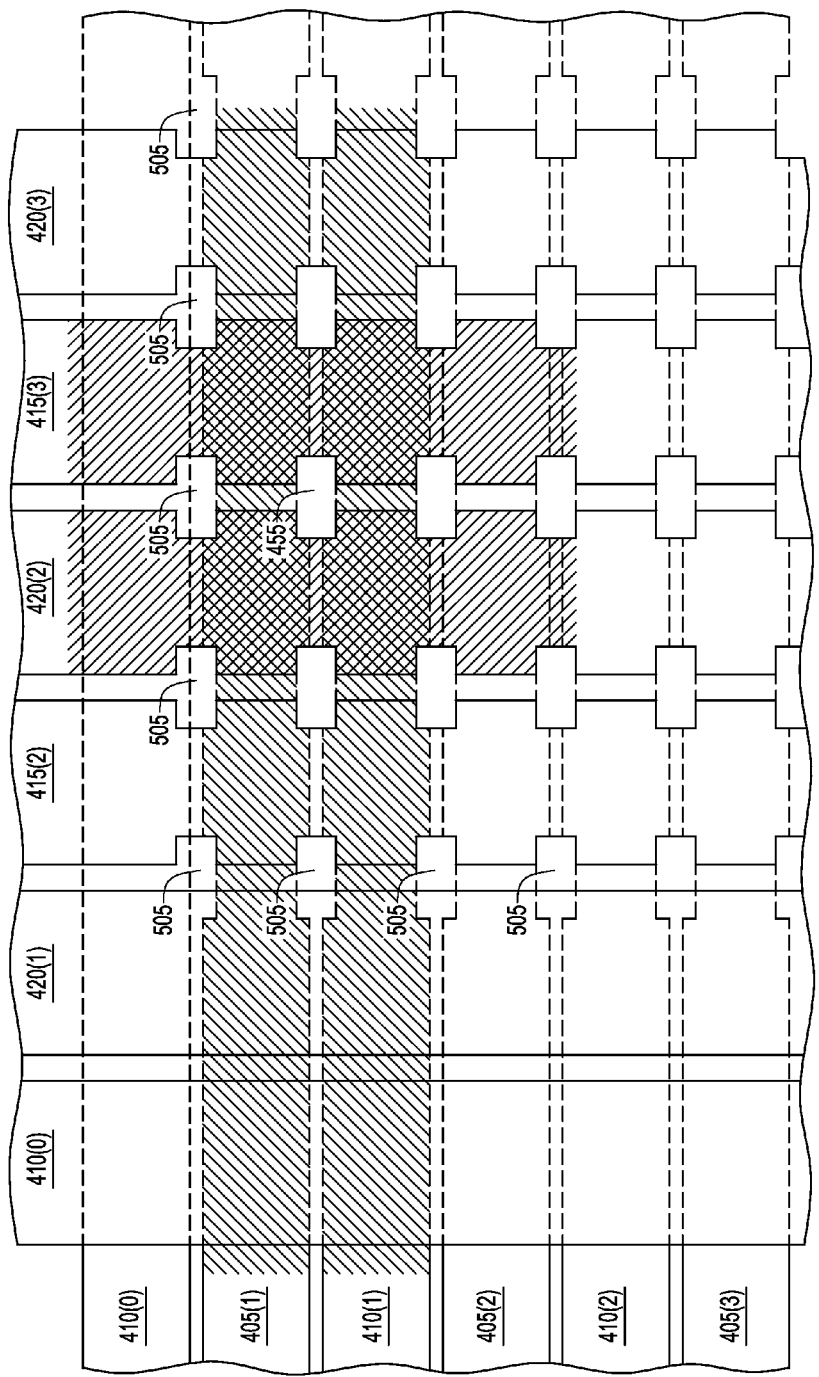

FIG. 11-13 illustrate partial schematic plan views depicting the example high capacity I/O cell structure of FIG. 4. During a design phase of the layout of die 110, an IR drop analysis of the die layout model is performed to determine optimum placement of high capacity I/O cell structures. Optimum placement includes placing a number of high capacity I/O cell structures close to areas of great power consumption, such as close to or above the core(s) of the die 110, although a number of high capacity I/O cell structures can also be placed in other areas. Placement of high capacity I/O cell structures also takes into account the spacing of the probe pins, which may be greater due to the larger pins used. It is beneficial to place the overall number of high capacity I/O cells in a manner that reduces the number of probe pins that make contact with the die during testing, which also reduces the cost of the probe card. Placing the high capacity I/O cell structures in the layout also incorporates a repeating pattern of notches into the die layout model's power supply lines that fall under each high capacity I/O cell structure, as well as the via connections between the contact pad of the high capacity I/O cell and underlying power supply lines or signal lines. By incorporating the high capacity I/O cells into the die's power distribution grid, the IR drop introduced into the power distribution grid by the high capacity I/O cell is minimized.

FIG. 11 illustrates an example layout for the power supply lines in the next-to-top metal layer (or lower metal layer of the top two metal layers). Alternating power and ground lines 410 and 405 are patterned to form rows of repeating notches 1105 along the edges of the line segments that fall under the exposed contact pad of the high capacity I/O cell (e.g., within the perimeter of opening 315). Notches 1105 on neighboring line segments form hollows 1110. Dielectric material is formed between the alternating lines 410 and 405, filling in the hollows to form part of an oxide pillar 455.

FIG. 12 illustrates an example layout for the power supply lines in the top metal layer (or upper metal layer of the top two metal layers). Alternating power and ground lines 415 and 420 are patterned to form rows of repeating notches 1205 along the edges of the line segments that fall under the exposed contact pad of the high capacity I/O cell (e.g., within the perimeter of opening 315). Notches 1205 on neighboring line segments form hollows 1210. Dielectric material 505 is formed between the alternating lines 415 and 420, filling in the hollows to form part of an oxide pillar 455. Dielectric material 505 is also formed between the lower metal layer shown in FIG. 11 and the upper metal layer shown in FIG. 12, forming part of an oxide pillar 455.

FIG. 13 illustrates the layouts of FIG. 11 and FIG. 12 in an overlapping manner. Lines 405(1) and 410(1) are shaded in a diagonal cross-hatch, and lines 420(2) and 415(3) are shaded in an opposing diagonal cross-hatch. Lines 405(1), 410(1), 420(2), and 415(3) overlap in such a manner that the notches 1105 of lines 405(1) and 410(1) coincide with the notches 1205 of lines 420(2) and 415(3) to form a three-dimensional space in which dielectric material 505 forms an oxide pillar 455. In other words, hollows 1110 and 1210 align to create spaces in which oxide pillars 455 are formed in a repeating pattern under the contact pad within the perimeter of opening 315. Such oxide pillars 455 provide mechanical structural integrity to protect the surrounding power supply lines from contact forces introduced by touching a probe pin to the contact pad of a high capacity I/O cell.

By now it should be appreciated that there has been provided a scalable approach for massively parallel wafer-level stress testing by implementation of high capacity I/O (Input/Output) cells that are integrated into the power distribution grid of each die of a wafer, which can also be deployed elsewhere in the device as signal pads. In one embodiment of the present disclosure, a wafer structure having a plurality of semiconductor die is provided, wherein each semiconductor die includes circuitry; a test pad for use in testing the circuitry, the test pad includes a first metal line and a second metal line in a first metal layer wherein the first and second lines run in parallel with each other, are insulated from each other, and are adjacent to each other; a third metal line and a fourth metal line in a second metal layer, wherein the second metal layer is at a different level from the first metal layer, and the third and fourth metal lines run in parallel with each other, are insulated from each other, are adjacent to each other, and run orthogonal to the first metal line and the second metal line; a first via coupled to the first metal line and the third metal line; a metal cover over a portion of the test pad that is for receiving a probe; and one or more external pins connected to the metal cover.

One aspect of the above embodiment provides that the first metal layer and the second metal layer are the two topmost conductive layers of a power distribution grid.

A further aspect of the above embodiment provides that the metal cover includes at least one of a bondable conductive layer and a deposited metal structure.

Another aspect of the above embodiment provides that the test pad includes one of a power supply terminal and a ground supply terminal for the circuitry during the testing.

A further aspect of the above embodiment provides that the test pad includes one of a group including an input pin, an output pin, a control signal pin, and a high voltage pin.

Another aspect of the above embodiment provides that the first metal line has portions of a first width and portions of a second width, and the first width is greater than the second width.

A further aspect of the above embodiment provides that the third metal line has portions of a third width and portions of a fourth width, and the third width is greater than the fourth width.

A still further aspect of the above embodiment provides that the second metal line widens and narrows with the first metal line whereby enhancing structural integrity of the die area under the test pad.

Another aspect of the above embodiment provides that the wafer structure further includes a second via coupled to the second metal line and the fourth metal line.

Another aspect of the above embodiment provides that the wafer structure further includes: at least four additional metal lines in the first metal layer running in parallel with each other and the first and second metal lines; and at least four additional metal lines in the second metal layer running in parallel with each other and the third and fourth metal lines.

Another aspect of the above embodiment provides for a method of testing the wafer structure, the method includes: coupling the probe to a first portion of the plurality of semiconductor die; and performing tests in parallel with the first portion of the plurality of semiconductor die using the probe, wherein the using the probe includes applying power to the test pad of each of the semiconductor die of the first portion of the plurality of semiconductor die.

A further aspect of the above embodiment provides that the method further includes: coupling the probe to a second portion of the plurality of semiconductor die; and performing tests in parallel with the second portion of the plurality of semiconductor die using the probe, wherein the using the probe includes applying power to the test pad of each of the semiconductor die of the second portion of the plurality of semiconductor die.

A still further aspect of the above embodiment provides that the first portion includes at least 100 semiconductor die and the second portion includes at least 100 semiconductor die.

Another aspect of the above embodiment provides that the first, second, third, and fourth metal lines function as a power distribution grid of the die.

Another aspect of the above embodiment provides that the first, second, third, and fourth metal lines have widths selected to avoid dishing that would negatively impact current carrying capability through the first, second third, and fourth metal lines to minimize a voltage drop across each semiconductor die.

In another embodiment of the present disclosure, a method of forming a test pad on a semiconductor die is provided, the method includes: after forming an interconnect for circuitry using a first plurality of metal layers, forming a first metal line and a second metal line using a first higher metal layer, wherein the first metal line and the second metal line have alternating portions of a first width and a second width greater than the first width, are parallel, and are insulated from each other; after forming the first metal line and the second metal line, forming a third metal line and a fourth metal line using a second higher metal layer, wherein the third metal line and the fourth metal line have alternating portions of a third width and a fourth width greater than the third width, are parallel, and are insulated from each; forming a via between the first metal line and the third metal line using the second higher metal layer; and forming a conductive cover layer over the third and fourth metal lines for receiving a probe and contacting the third metal line to the conductive cover layer;

One aspect of the above embodiment provides that the cover layer includes a bondable conductive layer, and the first plurality of metal layers, the first higher metal layer, and the second higher metal layer includes copper.

A further aspect of the above embodiment provides that the method further includes forming a via between the second metal line and the fourth metal line.

A still further aspect of the above embodiment provides that the first and the third metal lines carry power and the second and fourth metal lines carry ground.

In another embodiment of the present disclosure, a wafer structure having a plurality of semiconductor die is provided, wherein each semiconductor die includes: circuitry formed in a plurality of interconnect layers; a test pad for use in testing the circuitry, the test pad includes: a first metal line and a second metal line in a first metal layer over the plurality of interconnect layers, wherein the first and second lines run in parallel with each other, are insulated from each other, and are adjacent to each other; a third metal line and a fourth metal line in a second metal layer, wherein the second metal layer is at a different level from the first metal layer, and the third and fourth metal lines run in parallel with each other, are insulated from each other, are adjacent to each other, and run orthogonal to the first metal line and the second metal line; a first via coupled to the first metal line and the third metal line; and a metal cover over a portion of the test pad and coupled to the third metal line, wherein the cover is for receiving a probe applying one of a group consisting of power and ground.

The circuitry described herein may be implemented on a semiconductor substrate, which can be any semiconductor material or combinations of materials, such as gallium arsenide, silicon germanium, silicon-on-insulator (SOI), silicon, monocrystalline silicon, the like, and combinations of the above.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

As used herein the terms "substantial" and "substantially" mean sufficient to accomplish the stated purpose in a practical manner and that minor imperfections, if any, are not significant for the stated purpose.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A wafer structure having a plurality of semiconductor die, wherein each semiconductor die comprises:
   circuitry; and
   a test pad for use in testing the circuitry, the test pad comprising:
      a first metal line and a second metal line in a first metal layer wherein the first and second lines run in parallel with each other, are insulated from each other, and are adjacent to each other, wherein the second metal line widens and narrows in parallel with the first metal line whereby enhancing structural integrity of an area under the test pad;
      a third metal line and a fourth metal line in a second metal layer, wherein the second metal layer is at a different level from the first metal layer, and the third and fourth metal lines run in parallel with each other, are insulated from each other, are adjacent to each other, and run orthogonal to the first metal line and the second metal line;
      a first via connected to the first metal line and the third metal line;
      a metal cover over a portion of the test pad that is for receiving a probe; and
      one or more external pins connected to the metal cover.

2. The wafer structure of claim 1, wherein the first metal layer and the second metal layer are the two topmost conductive layers of a power distribution grid.

3. The wafer structure of claim 1, wherein the metal cover comprises at least one of a bondable conductive layer and a deposited metal structure.

4. The wafer structure of claim 1, wherein the first metal line is configured to carry a power supply voltage and the second metal line is configured to carry a ground supply voltage.

5. The wafer structure of claim 1, wherein the test pad comprises one of a group including an input pin, an output pin, a control signal pin, and a high voltage pin.

6. The wafer structure of claim 1, wherein the first metal line and the second metal line each have alternating wide portions of a first width and narrow portions of a second width, and the first width is greater than the second width.

7. The wafer structure of claim 6, wherein the third metal line and the fourth metal line each have alternating wide portions of a third width and narrow portions of a fourth width, wherein the fourth metal line widens and narrows in parallel with the third metal line, and the third width is greater than the fourth width.

8. The wafer structure of claim 1, further comprising a second via connected to the second metal line and the fourth metal line.

9. The wafer structure of claim 1, further comprising:
   at least four additional metal lines in the first metal layer running in parallel with each other and the first and second metal lines; and
   at least four additional metal lines in the second metal layer running in parallel with each other and the third and fourth metal lines.

10. A method of testing the wafer structure of claim 1, comprising:
    coupling the probe to a first portion of the plurality of semiconductor die; and
    performing tests in parallel with the first portion of the plurality of semiconductor die using the probe, wherein the using the probe includes applying power to the test pad of each of the semiconductor die of the first portion of the plurality of semiconductor die.

11. The method of claim 10, further comprising:
    coupling the probe to a second portion of the plurality of semiconductor die; and
    performing tests in parallel with the second portion of the plurality of semiconductor die using the probe, wherein the using the probe includes applying power to the test pad of each of the semiconductor die of the second portion of the plurality of semiconductor die.

12. The method of claim 11, wherein the first portion comprises at least 100 semiconductor die and the second portion comprises at least 100 semiconductor die.

13. The wafer structure of claim 1, wherein the first, second, third, and fourth metal lines function as a power distribution grid of the die.

14. The wafer structure of claim 1, wherein the first, second, third, and fourth metal lines have widths selected to avoid dishing that would negatively impact current carrying capability through the first, second third, and fourth metal lines to minimize a voltage drop across each semiconductor die.

15. The wafer structure of claim 7, wherein:
    the narrow portions of the first metal line and the second metal line are separated by a first space,
    the narrow portions of the third metal line and the fourth metal line are separated by a second space, and
    the first space and the second space overlap and define a cross-sectional area of an oxide structure that extends through the first and second metal layers, wherein rigidity of the oxide structure provides structural integrity to protect the first, second, third, and fourth metal lines.

16. The wafer structure of claim 1, wherein the metal cover is connected by at least one via to the first metal line.

17. A method of forming a test pad on a semiconductor die, comprising:
    after forming circuitry in a plurality of interconnect layers using a first plurality of metal layers, forming a first metal line and a second metal line using a first higher metal layer, wherein the first metal line and the second metal line have alternating narrow portions of a first width and wide portions of a second width greater than the first width, run in parallel with each other, and are insulated from each other, wherein the second metal line widens and narrows in parallel with the first metal line whereby enhancing structural integrity of an area under the test pad;
    after forming the first metal line and the second metal line, forming a third metal line and a fourth metal line using a second higher metal layer, wherein the third metal line and the fourth metal line have alternating narrow portions of a third width and wide portions of a fourth width greater than the third width, run in parallel with each other, and are insulated from each other;

forming a via between the first metal line and the third metal line using the second higher metal layer; and forming a conductive cover layer over the third and fourth metal lines for receiving a probe and contacting the third metal line to the conductive cover layer.

18. The method of claim 17, wherein the cover layer comprises a bondable conductive layer, and the first plurality of metal layers, the first higher metal layer, and the second higher metal layer comprise copper.

19. The method of claim 17, further comprising forming a via between the second metal line and the fourth metal line.

20. The method of claim 17, wherein the first and the third metal lines carry power and the second and fourth metal lines carry ground.

\* \* \* \* \*